(12) United States Patent
Nam et al.

(10) Patent No.: US 7,144,771 B2
(45) Date of Patent: Dec. 5, 2006

(54) METHODS OF FORMING ELECTRONIC DEVICES INCLUDING DIELECTRIC LAYERS WITH DIFFERENT DENSITIES OF TITANIUM

(75) Inventors: Gab-jin Nam, Kyungki-do (KR); Seung-hwan Lee, Seoul (KR); Ki-chul Kim, Kyungki-do (KR); Jae-soon Lim, Seoul (KR); Sung-tae Kim, Seoul (KR); Young-sun Kim, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 146 days.

(21) Appl. No.: 10/616,056

(22) Filed: Jul. 9, 2003

(65) Prior Publication Data

US 2004/0075130 A1    Apr. 22, 2004

(30) Foreign Application Priority Data

Oct. 16, 2002    (KR) .................... 10-2002-0063024

(51) Int. Cl.
*H01L 21/8242*    (2006.01)

(52) U.S. Cl. ....................... 438/244; 438/253
(58) Field of Classification Search ............. 438/244, 438/253, 398
See application file for complete search history.

(56) References Cited

U.S. PATENT DOCUMENTS 6,339,009 B1 *    1/2002    Lee et al. ................ 438/396
6,570,253 B1 *    5/2003    Lim et al. ................ 257/758
6,640,403 B1 *   11/2003    Shih et al. ............... 29/25.41
6,734,480 B1 *    5/2004    Chung et al. ............. 257/296
2004/0018307 A1 * 1/2004   Park et al. .............. 427/255.36

FOREIGN PATENT DOCUMENTS

| JP | 2001-160557 | * | 6/2001 |
| KR | 2001-0045961 |   | 6/2001 |
| KR | 010045961 |     | 6/2001 |
| KR | 2001-0060566 |   | 7/2001 |
| KR | 010060566 A |   | 7/2001 |

OTHER PUBLICATIONS

English Translation of Korean Notice of Office Action for Korean App. No. 10-2002-0063024, Jul. 28, 2004.
Korean Notice of Office Action for Korean App. No. 10-2002-0063024, Jul. 28, 2004.

* cited by examiner

*Primary Examiner*—David S. Blum
(74) *Attorney, Agent, or Firm*—Myers Bigel Sibley & Sajovec

(57) ABSTRACT

Methods of forming an electronic device include providing a fist electrode, providing a dielectric oxide layer on the first electrode, and providing a second electrode on the dielectric oxide layer so that the dielectric oxide layer is between the first and second electrodes. More particularly, a first portion of the dielectric oxide layer adjacent the first electrode can have a first density of titanium, and a second portion of the dielectric oxide layer opposite the first electrode can have a second density of titanium different than the first density. Related structures are also discussed.

32 Claims, 7 Drawing Sheets

METHODS OF FORMING ELECTRONIC DEVICES INCLUDING DIELECTRIC LAYERS WITH DIFFERENT DENSITIES OF TITANIUM

RELATED APPLICATIONS

This application claims priority from Korean Patent Application No. 2002-63024, filed Oct. 16, 2002, in the Korean Intellectual Property Office, the disclosure of which is incorporated herein in its entirety by reference.

BACKGROUND OF THE INVENTION

1. Field of the Invention

The present invention relates to electronic devices and methods for manufacturing electronic devices, and more particularly, to electronic devices having dielectric layers and related methods.

2. Description of the Related Art

As the integration density of semiconductor memory devices increases, the area of a cell and the space between cells decrease. However, it may be desirable that a capacitor maintain a prescribed capacitance, and thus the capacitor providing high capacitance while occupying a small area may be desired. To maintain high capacitance in capacitors occupying less substrate surface area, various measures have been suggested including using a high dielectric material for the dielectric layer, reducing a thickness of the dielectric layer, and/or increasing a surface area of a lower electrode.

Among those suggestions, both the measures of reducing a thickness of the dielectric layer and increasing a surface area of the lower electrode may have reached limits of current processing and/or physical capabilities, and thus further increases of capacitance may rely on use of dielectric materials having higher dielectric constants. A tantalum oxide ($Ta_2O_5$) film having a dielectric constant $\epsilon$ of 24 may be used for the dielectric layer of the capacitor. Although a dielectric layer formed of a tantalum oxide film may provide a relatively high dielectric constant, use of tantalum oxide may present new difficulties.

First, a tantalum oxide film may have an unstable chemical stoichiometric ratio due to a lack of oxygen so that an undesirable leakage current may result. To replenish the film with oxygen, a thermal oxidation may be applied to the tantalum oxide film. During the thermal oxidation, however, oxygen ions may easily penetrate the tantalum oxide film, and thus a silicon oxide film may be generated by reaction of the upper electrode with the oxygen ions at an interfacial surface between the tantalum oxide film and the lower electrode. Consequently, the effective oxide thickness of the dielectric layer (Toxeq) may increase, and the effective dielectric constant of the tantalum oxide film may decrease. Thus, the tantalum oxide film may neither reduce leakage current nor improve dielectric characteristics.

SUMMARY OF THE INVENTION

According to embodiments of the present invention, methods of forming an electronic device can include providing a first electrode, providing a dielectric oxide layer on the first electrode, and providing a second electrode on the dielectric oxide layer so that the dielectric oxide layer is between the first and second electrodes. More particularly, the dielectric oxide layer can include titanium, wherein a first portion of the dielectric oxide layer adjacent the first electrode has a first density of titanium, and wherein a second portion of the dielectric oxide layer opposite the first electrode has a second density of titanium different than the first density. In addition, the dielectric oxide layer may include tantalum, and the dielectric oxide layer can be a layer of tantalum titanium oxide. Moreover, the first electrode can be provided on a substrate so that the first electrode is between the substrate and the dielectric oxide layer.

The first density of titanium can be greater than the second density of titanium with the first density of titanium in the range of approximately 0.1 to 15 percent and with the second density of titanium in the range of approximately 0.001 to 3 percent. In an alternative, the first density of titanium is less than the second density of titanium with the first density of titanium in the range of approximately 0.1 to 15 percent and the second density of titanium in the range of approximately 10 to 20 percent.

Each of the first and second electrodes may comprise at least one of doped polysilicon, metal, metal oxide, metal nitride, and/or metal oxynitride. In addition, a reaction suppressing layer may be provided between the first electrode and the dielectric layer. More particularly, the reaction suppressing layer may comprise at least one of silicon nitride, silicon oxide, and/or silicon oxynitride.

According to additional embodiments of the present invention, methods of forming an electronic device may include providing a first electrode, providing a reaction suppressing layer on the first electrode, providing a dielectric oxide layer including titanium on the reaction suppressing layer, and providing a second electrode on the dielectric oxide layer. In particular, the reaction suppressing layer may comprise at least one of silicon nitride, silicon oxide, and/or silicon oxynitride. In addition, the dielectric oxide layer may include tantalum, and the dielectric oxide layer may include a layer of tantalum titanium oxide. In addition, the first electrode may be provided on a substrate so that the first electrode is between the substrate and the reaction suppressing layer.

Moreover, a first portion of the dielectric oxide layer adjacent the reaction suppressing layer may have a first density of titanium, and a second portion of the dielectric oxide layer opposite the reaction suppressing layer may have a second density of titanium different than the first density. More particularly, the first density of titanium can greater than the second density of titanium, with the first density of titanium in the range of approximately 0.1 to 15 percent and with the second density of titanium in the range of approximately 0.001 to 3 percent. In an alternative, the first density of titanium can be less than the second density of titanium, with the first density of titanium in the range of approximately 0.1 to 15 percent and with the second density of titanium in the range of approximately 10 to 20 percent. In addition, each of the first and second electrodes may comprise at least one of doped polysilicon, metal, metal oxide, metal nitride, and/or metal oxynitride.

According to yet additional embodiments of the present invention, an electronic device may include a first electrode, a dielectric oxide layer on the first electrode, and a second electrode on the dielectric oxide layer. More particularly, the dielectric oxide layer may include titanium, with a first portion of the dielectric oxide layer adjacent the first electrode having a first density of titanium and with a second portion of the dielectric oxide layer opposite the first electrode having a second density of titanium different than the first density. The dielectric oxide layer may include titanium and may include a layer of tantalum titanium oxide. The electronic device may also include a substrate on the first electrode so that the first electrode is between the substrate and the dielectric oxide layer.

In addition, the first density of titanium can be greater than the second density of titanium, with the first density of titanium in the range of approximately 0.1 to 15 percent and with the second density of titanium in the range of approximately 0.001 to 3 percent. In an alternative, the first density of titanium can be less than the second density of titanium, with the first density of titanium in the range of approximately 0.1 to 15 percent and with the second density of titanium in the range of approximately 10 to 20 percent.

Each of the first and second electrodes may include at least one of doped polysilicon, metal, metal oxide, metal nitride, and/or metal oxynitride. The electronic device can also include a reaction suppressing layer between the first electrode and the dielectric layer. More particularly, the reaction suppressing layer may include at least one of silicon nitride, silicon oxide, and/or silicon oxynitride.

According to still additional embodiments of the present invention, an electronic device may include a first electrode, a reaction suppressing layer on the first electrode, a dielectric oxide layer including titanium on the reaction suppressing layer, and a second electrode on the dielectric oxide layer. The reaction suppressing layer may include at least one of silicon nitride, silicon oxide, and/or silicon oxynitride. In addition, the dielectric oxide layer may also include tantalum, and the dielectric oxide layer may include a layer of tantalum titanium oxide. The electronic device may also include a substrate on the first electrode so that the first electrode is between the substrate and the reaction suppressing layer.

In addition, a first portion of the dielectric oxide layer adjacent the reaction suppressing layer may have a first density of titanium, and a second portion of the dielectric oxide layer opposite the reaction suppressing layer may have a second density of titanium different than the first density. More particularly, the first density of titanium can be greater than the second density of titanium, with the first density of titanium in the range of approximately 0.1 to 15 percent and with the second density of titanium in the range of approximately 0.001 to 3 percent. In an alternative, the first density of titanium can be less than the second density of titanium, with the first density of titanium in the range of approximately 0.1 to 15 percent and with the second density of titanium in the range of approximately 10 to 20 percent. In addition, each of the first and second electrodes may include at least one of doped polysilicon, metal, metal oxide, metal nitride, and/or metal oxynitride.

DETAILED DESCRIPTION OF THE INVENTION

Figure 1:
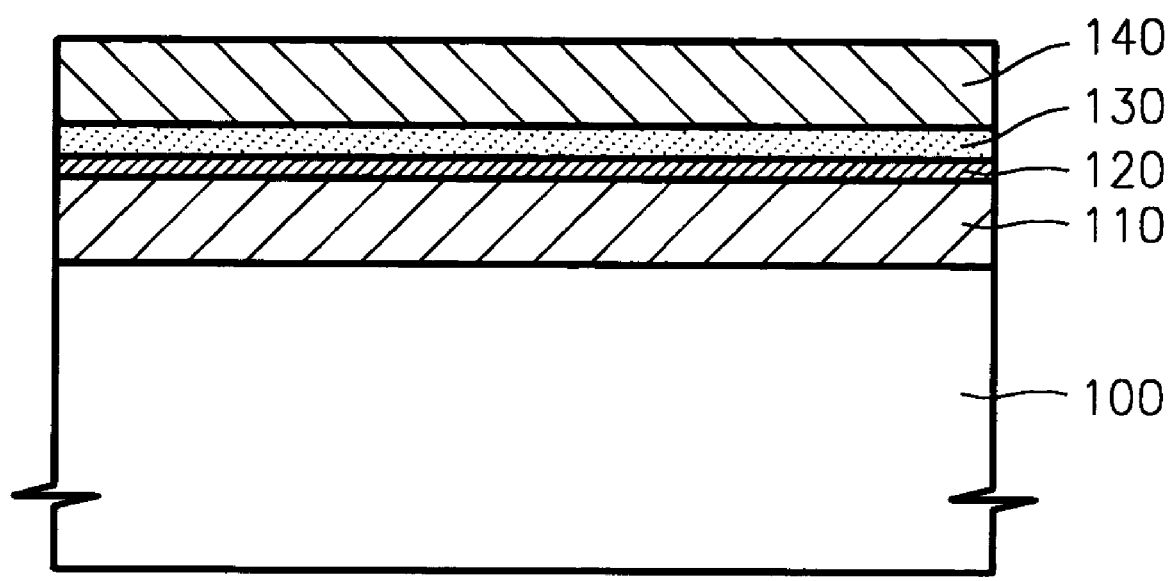
FIG. 1 is a cross-sectional view of a semiconductor device such as a memory device according to first embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. It is also noted that like reference numerals may be used to designate identical or corresponding parts throughout the several views.

Referring to FIG. 1, a semiconductor substrate 100, such as a silicon substrate, is provided. On a surface of the semiconductor substrate 100, semiconductor devices, metal interconnections, and/or insulating films may be formed. A lower electrode 110 is formed on an upper surface of the semiconductor substrate 100. The lower electrode 110 can be formed of a doped polysilicon film, a metal film, a metal oxide film, a metal nitride film, and/or a metal oxynitride film. In addition, the lower electrode 110 may be formed in a stack structure or have the shape of a box, a cylinder, a fin, a trench, or the like to increase its surface area.

On the surface of the lower electrode 110, a reaction suppressing layer 120 can be formed. The reaction suppressing layer 120 can be a layer to reduce a reaction between the lower electrode 110 and a dielectric layer to be formed later. The reaction suppressing layer 120 may be formed of silicon nitride, silicon oxide, and/or silicon oxynitride, which may be treated using a rapid thermal nitridation (RTN), a rapid thermal oxidation (RTO), and/or a mixed treatment of RTN and RTO. The RTN can be performed at a temperature in the range of approximately 500° C. to 900° C. in an atmosphere including nitrogen (such as an atmosphere including $NH_3$ and/or $N_2$). The RTO can be performed at a temperature in the range of approximately 500° C. to 900° C. in an atmosphere including oxygen (such as an atmosphere including $O_2$ and/or $N_2O$). Here, it is possible to lower an activation energy by irradiating a plasma or ultraviolet ray, or the like, when performing the RTN, RTO, or the mixed treatment of RTN and RTO. In addition, the reaction suppressing layer 120 may be formed using chemical vapor deposition (CVD).

The reaction suppressing layer 120 may suppress a reaction between the surface of the lower electrode 110 and the dielectric layer, may reduce penetration of oxygen ions into the lower electrode 110 during a subsequent oxidation process, and may reduce dispersion of an electric field applied to the dielectric layer. According to first embodiments of the present invention, a silicon nitride film to which an RTN treatment is applied can be used for the reaction suppressing layer 120.

Figure 2A:
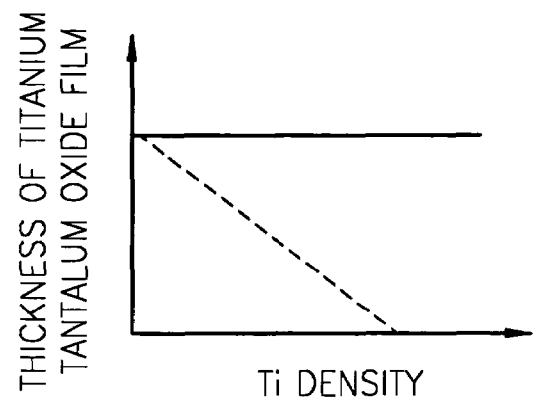
FIGS. 2A through 2C are graphs illustrating density of titanium of a titanium tantalum oxide film with respect to the thickness of the titanium tantalum oxide film according to first embodiments of the present invention.
Figure 2B:
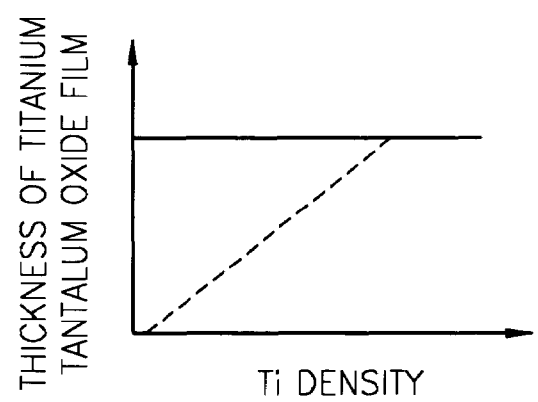
Figure 2C:
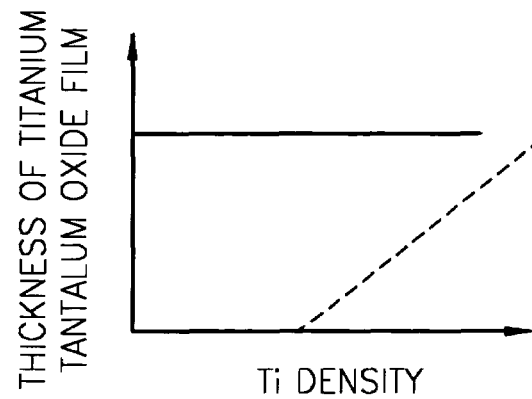

As the dielectric layer, a tantalum oxide film doped with titanium (($Ta_2O_5)_{1-x}$ $(TiO_2)_x$, hereinafter referred to as a tantalum titanium oxide film 130) is deposited on an upper surface of the reaction suppressing layer 120. The tantalum titanium oxide film 130 is formed to have different densities (mass/volume) of titanium according to its thickness. That is, the density of titanium of the tantalum titanium oxide film 130 may decrease as the thickness of the tantalum titanium oxide film 130 increases as shown in FIG. 2A, or the density of titanium of the tantalum titanium oxide film 130 may increase in proportion to the thickness of the tantalum titanium oxide film 130 as shown in FIGS. 2A and 2B. The density of titanium adjacent to the lower portion of the dielectric layer in the tantalum titanium oxide film 130 can be in the range of approximately 0.1% to 15% for reasons discussed below.

Figure 3:
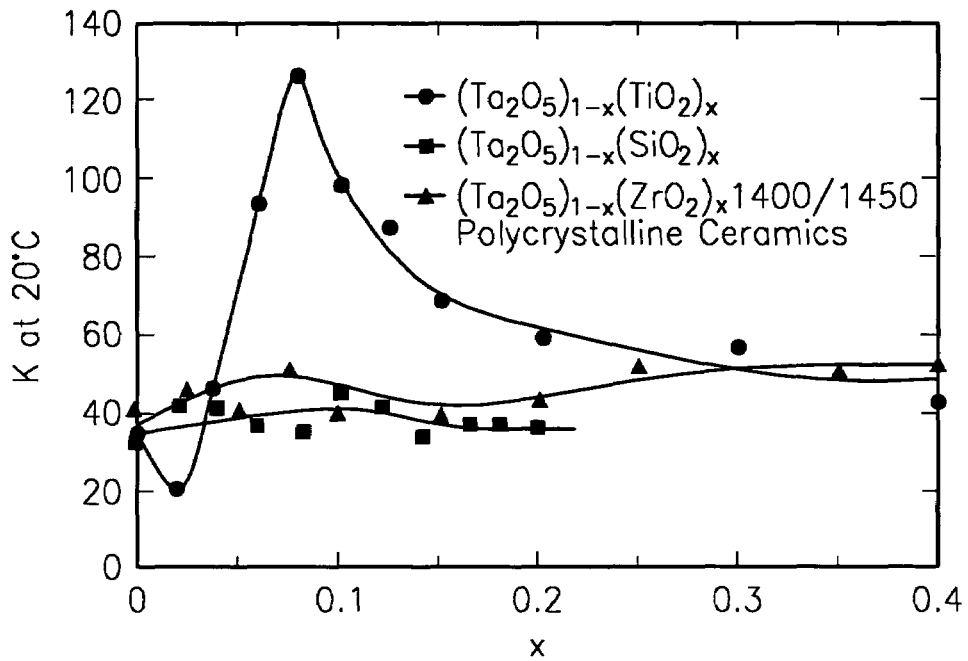
FIG. 3 is a graph illustrating dielectric constants of a tantalum oxide film doped dopants.

FIG. 3 is a graph illustrating the dieletric contrast of doped tantalum oxide films. As shown, the tantalum oxide films are respectively doped with titanium Ti, silicon Si, and zirconium Zr. The graph does not show great changes in the dielectric constant of the tantalum oxide film when the tantalum oxide film is doped with Si or Zr. However, the dielectric constant of the tantalum oxide film is can be significantly increased when the tantalum oxide film is doped with titanium in the range of approximately 0.1%–15%, as shown in the graph.

Figure 4:
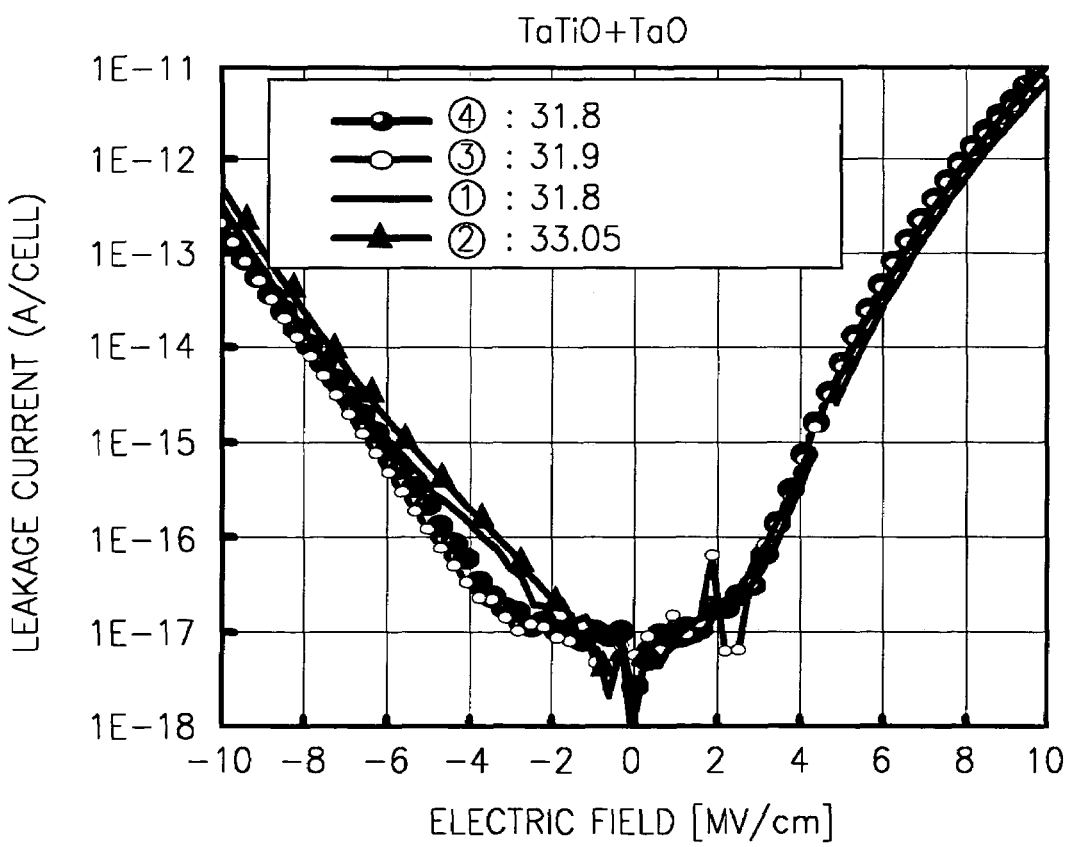
FIG. 4 is a graph illustrating leakage currents when a negative voltage is applied to a dielectric layer.

Referring to FIG. 4, which is a graph illustrating leakage currents when a negative voltage is applied to respective dielectric layers, the effective oxide thickness of the dielectric layer (Toxeq) and the leakage current are measured when the dielectric layer changes. Here, the dielectric constants increase as the equivalent oxide thickness Toxeq decreases. In FIG. 4, (1) denotes a case where a tantalum oxide film of a thickness of 70 Å is formed, (2) denotes a case where a tantalum titanium oxide film of a thickness of 50 Å is deposited on an upper surface of a tantalum oxide film of a thickness of 20 Å, (3) denotes a case where a tantalum oxide film of a thickness of 50 Å is deposited on the upper surface of a tantalum titanium oxide film of a thickness of 20 Å, and (4) denotes a case where a tantalum titanium oxide film of a thickness of 70 Å is formed. Here, the tantalum titanium oxide film includes titanium doped in the range of approximately 5% to 15%.

According to the graph of FIG. 4, in case (1), the leakage current starts increasing when the equivalent oxide thickness Toxeq is approximately 31.8 Å. In case (2), the leakage current starts increasing when the equivalent oxide thickness Toxeq is approximately 33.05 Å. In case (3), the leakage current starts increasing when the equivalent oxide thickness Toxeq is approximately 31.9 Å. In case (4), the leakage current starts increasing when the equivalent oxide thickness Toxeq is approximately 31.8 Å.

As shown in the graph, the case where the tantalum titanium oxide film is deposited on the upper surface of the tantalum oxide film and the case where only the tantalum oxide film is formed are similar in terms of the equivalent oxide thickness Toxeq at the starting point of the increase in the leakage current. In the case where the tantalum titanium oxide film is formed on the tantalum oxide film, the thickness of the Toxeq is larger than the cases (1), (3), and (4). That is, none of the dielectric layers using the tantalum titanium oxide film as a dielectric material have low dielectric constants. They may provide improved dielectric constants only when a selected amount of titanium is included at the lower portion of a tantalum titanium oxide film.

Therefore, according to embodiments of the present invention, the titanium may be implanted into the tantalum oxide film used as the capacitor or other dielectric layer, and the density of titanium at the interfacial area with the reaction suppressing layer 120 adjacent to the lower electrode 110 can be adjusted to be in the range of approximately 0.1% to 15%. Here, the tantalum titanium oxide film 130 may be divided into two kinds of films according to how a precursor is supplied to the tantalum titanium oxide film.

Figure 5:
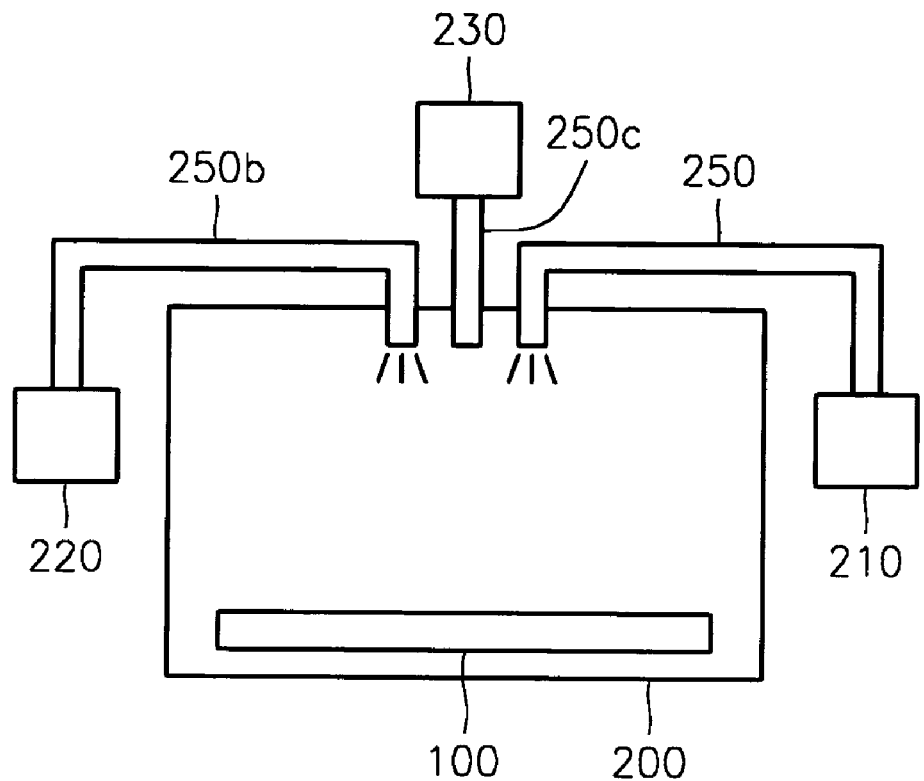
FIG. 5 is a schematic diagram of a first apparatus for depositing a dielectric layer according to embodiments of the present invention.

First, a tantalum precursor, a titanium precursor, and oxygen gas may be mixed within a reaction chamber of reactor 200. In this method, the tantalum precursor, titanium precursor, and oxygen gas, which are in a gas form, can be separately supplied to reactor 200. Here, they can be supplied to the reactor 200 in gas form using a carrier gas such as hydrogen, helium, and/or nitrogen. The tantalum precursor, the titanium precursor, and the oxygen gas supplied into the reactor 200 can be mixed within the reactor 200. The mixed gas in the reactor 200 reacts on the upper surface of the semiconductor substrate 100, preferably on the top surface of the reaction suppressing layer 120, to form the tantalum titanium oxide film 130. Here, the density of titanium of the lower portion of the tantalum titanium oxide film 130 can be adjusted to be in the range of approximately 0.1% to 15%. As shown in FIG. 5, an apparatus performing the above process can include the reactor 200, a first reactant source 210 which accommodates the tantalum precursor, a second reactant source 220 which accommodates the titanium precursor, a third reactant source 230 which accommodates oxygen gas, and gas lines 250a, 250b and 250c which connect the reactor 200 with the reactant sources 210, 220, and 230, respectively. Here, a metal alkoxide (such as $Ta(OC_2H_5)_5$), an organometalic (such as a metal beta deketonate) and/or a metal halide (such as $TaCl_5$) may be used for the tantalum precursor. As the titanium precursor, compounds such as $Ti(OCH(CH_3)_2)_4$, $Ti(OC_2H_5)_4$, $TiCl_4$, and/or a tetrakis-dimethylamido-titanium (TDMAT) may be used. This method may be advantageous in that the second reactant source 220 accommodating the titanium precursor (which supplies the titanium) can be separately controlled, and thus the density of titanium can be easily controlled. Second, the tantalum precursor and the titanium precursor may be mixed outside of the reactor, and then the mixed material may be supplied into the reactor.

Figure 6:
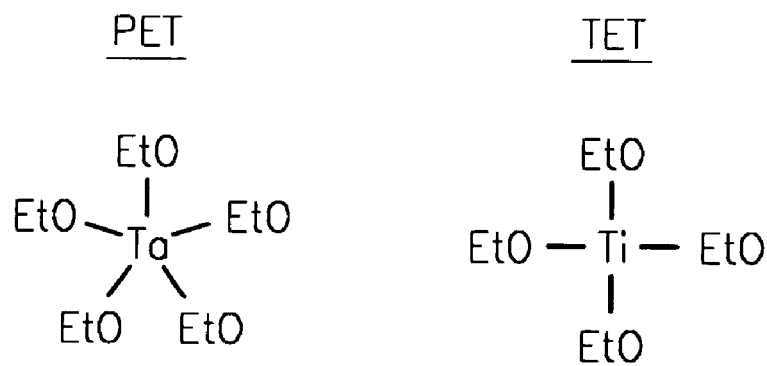
FIG. 6 illustrates chemical formulas of a tantalum precursor and a titanium precursor used in a reactor external mixing method according to embodiments of the present invention.
Figure 7:
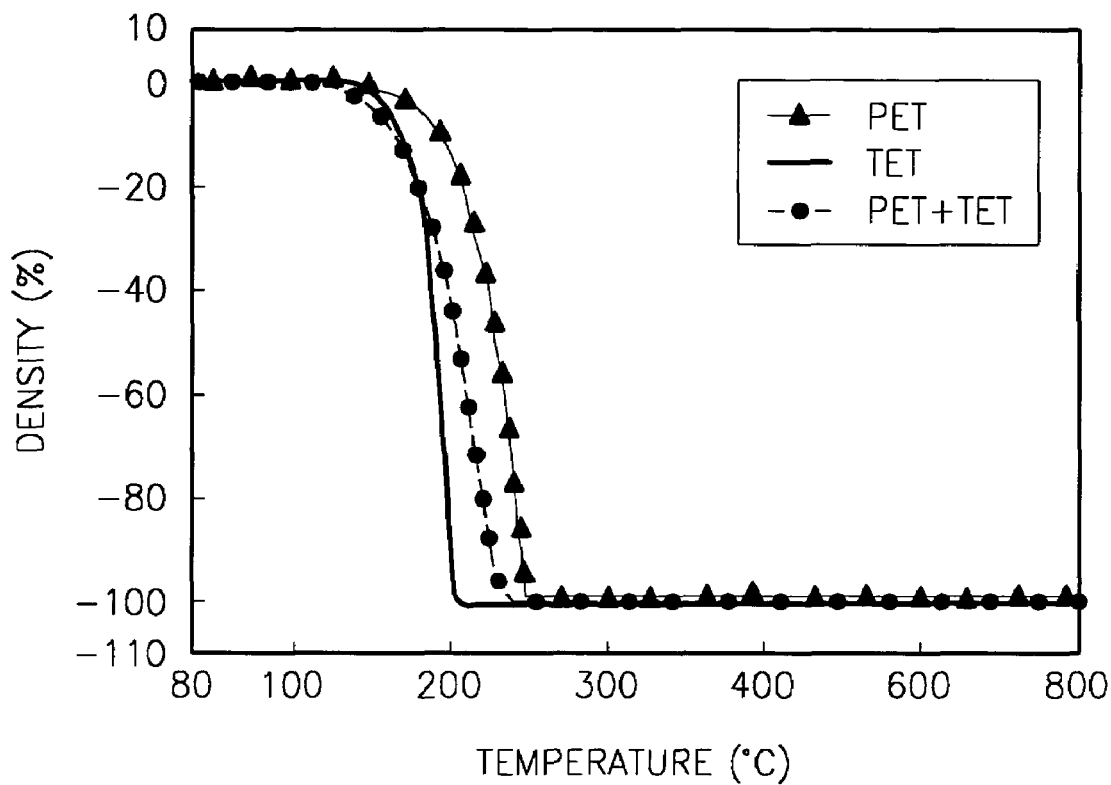
FIG. 7 is a graph illustrating results of TGA analysis of a tantalum precursor, a titanium precursor, and a combination of the tantalum precursor and the titanium precursor according to embodiments of the present invention.

As shown in FIG. 6, the tantalum precursor and the titanium precursor are respectively illustrated as a pentaethoxy tantalum Ta $(OCH_2CH_3)_6$ (hereinafter referred to as PET) and a tetraethoxy titanium $Ti(OCH_2CH_3)_4$ (hereinafter referred to as TET), and these precursors are similar in structure where a plurality of pentaethoxy groups $(OCH_2CH_3)$ are connected to one metal atom. Accordingly, if PET and TET are mixed, the mixed precursor may have some of the characteristics of PET and some of the characteristics of TET and the mixture may move as if it is one material as shown in FIG. 7.

Figure 8:
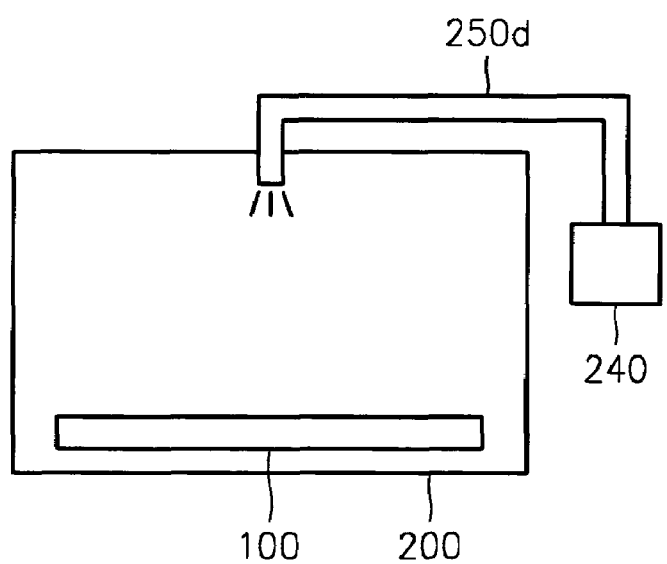
FIG. 8 is a schematic diagram illustrating a second apparatus for depositing a dielectric layer according to the first embodiments of the present invention.

As shown in FIG. 8, first the PET precursor and the TET precursor can be mixed in a reactant source 240 outside of the reactor 200. Then the mixed precursor can be supplied to the reactor 200, and the tantalum titanium oxide film 130 can be formed. Reference numeral 250d denotes a gas line which connects the reactant source 240, including the mixed precursor, to the reactor 200.

Here, the density of titanium may be controlled by process conditions within the reactor 200. The process conditions include the deposition temperature, the deposition pressure, the flow rate of the precursor, the flow rate of the carrier gas, and the flow rate of oxygen gas, or the like. In particular, the deposition temperature and the flow rate of the precursor can be closely related to the density of titanium. According to experiment, if the deposition temperature increases from approximately 450° C. to 500° C., the density of titanium within the tantalum oxide film increases from approximately 1.7% to 4.2%. In addition, if the flow rate of the titanium precursor within the mixed precursor increases from approximately 16% to 50%, the density of titanium increases approximately 17.6%. Thus, the density of titanium may be adjusted based on these experimental results. This process is advantageous in that the structure of the reactor may be simplified.

The tantalum titanium oxide film 130 formed using the above processes can be formed at a temperature in the range of approximately 100° C. to 700° C., and more particularly in the range of approximately 400° C. to 500° C., and at a pressure in the range of approximately 100 to 760 mTorr. In addition, it may be desirable for the tantalum precursor and the titanium precursor to be supplied at a rate in the range of approximately 5 mg/min to 200 mg/min and for the oxygen gas to be supplied at a rate in the range of approximately 10 sccm to 10 slm when the tantalum titanium oxide film 130 is deposited. Between forming the reaction suppressing layer 120 and forming the tantalum titanium oxide film 130, flowing a tantalum gas may be included for more effective deposition.

Returning to FIG. 1, the tantalum titanium oxide film 130 formed as described above can be thermally processed to reduce leakage current. It may be desirable to thermally process the tantalum titanium oxide film 130 in an oxygen atmosphere. Energy sources for the thermal process may be heat, ozone ($O_3$), oxygen plasma ($O_2$-plasma), and/or ultraviolet ozone (UV-$O_3$). Further, $O_2$, $O_3$, or $N_2O$ gas may be supplied into the reactor chamber to create the oxygen atmosphere.

When the thermal process is performed, oxygen ions may penetrate into the tantalum titanium oxide film 130. However, the reaction suppressing layer 120 at the interfacial area between the lower electrode 110 and the tantalum titanium oxide film 130 may reduce penetration of oxygen ions into the lower electrode 110 so that formation of an undesired oxide film may be reduced. Thus, the equivalent oxide thickness Toxeq of the tantalum titanium oxide film may be reduced. In addition, the thermal process can be repeated in consideration of the leakage current.

Referring to FIG. 1, an upper electrode 140 can be formed on an upper surface of the tantalum titanium oxide film 130. The upper electrode 140 may be a conductive layer of a material such as a doped polysilicon film, a metal film, a metal oxide film, a metal oxynitride film, or the like. In some embodiments, TiN can be used for the upper electrode 140.

TiN may have a relatively low reactivity with respect to the dielectric layer, and, thus, deterioration of the dielectric layer can be reduced.

According to some embodiments, a decrease in the dielectric constant can be reduced by using the tantalum titanium oxide film as the dielectric layer while the thermal process is performed for reducing the leakage current. Consequently, leakage current can be reduced, and dielectric characteristics can be improved.

Figure 9:
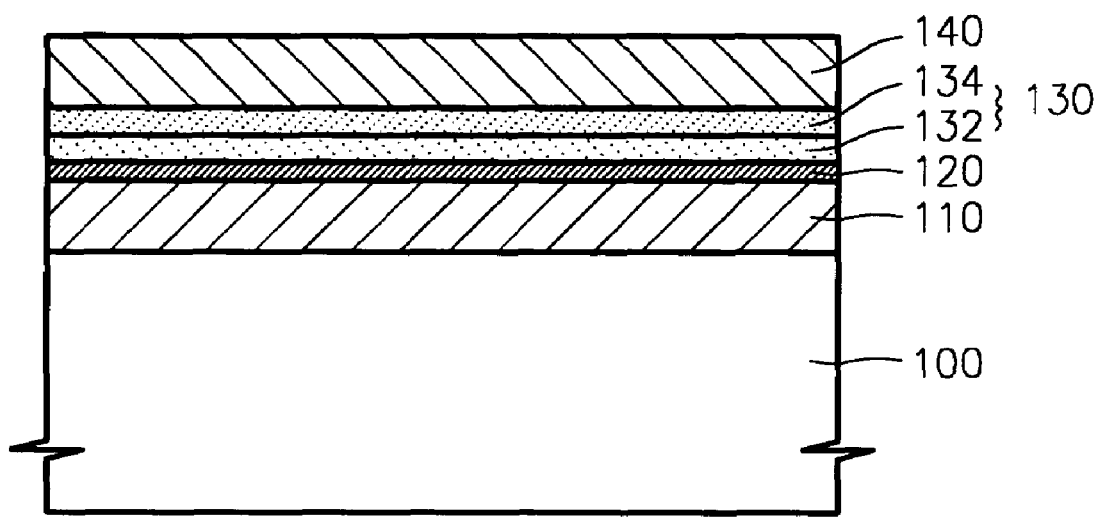
FIG. 9 is a cross-sectional view of a semiconductor device such as a memory device according to second embodiments of the present invention.
Figure 10:
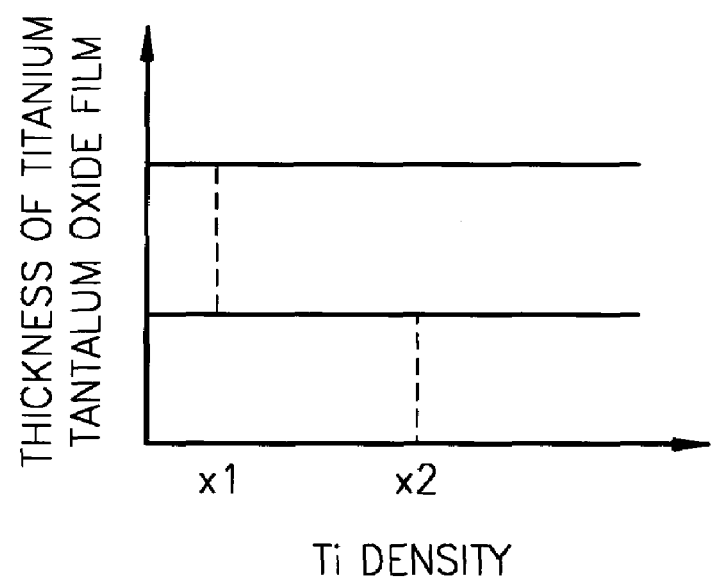
FIG. 10 is a graph illustrating densities of titanium with respect to the thickness of the tantalum titanium oxide film according to second embodiments of the present invention.

FIG. 9 is a cross-sectional view of a semiconductor device such as a memory device according to second embodiments of the present invention, and FIG. 10 is a graph illustrating the density of titanium with respect to the thickness of the tantalum titanium oxide film according to the second embodiments of the present invention. The same elements as those of the description of the first embodiments will have the same reference numerals and overlapping descriptions will be omitted.

Referring to FIGS. 9 and 10, a first tantalum titanium oxide film 132, having a relatively high-density of doped titanium, is deposited on the upper surface of the lower electrode 110 over the semiconductor substrate 100. The density of titanium (X2) of the first tantalum titanium oxide film 132 can be in the range of approximately 0.1% to 15%, and more particularly in the range of approximately 7.5% to 8.5%.

A second tantalum titanium oxide film 134, having a relatively low-density of doped titanium can be deposited on an upper surface of the first tantalum titanium oxide film 132. The density of titanium (X1) of the second tantalum titanium oxide film 134 is lower than X2 and X1 can be in the range of approximately 0.001% to 3% titanium. In addition, the first and the second tantalum titanium oxide films 132 and 134 can be formed by supplying the precursors separately or by supplying the mixed precursor to the reactor chamber. Further, the first and the second tantalum titanium oxide films 132 and 134 can be formed successively. After that, the thermal process can be performed, and the upper electrode 140 can be formed in the same manner as discussed above with respect to the first embodiments. As discussed above, even though the tantalum titanium oxide film is formed in multiple layers, the effects thereof can be similar to effects discussed above with respect to the first embodiments.

Figure 11:
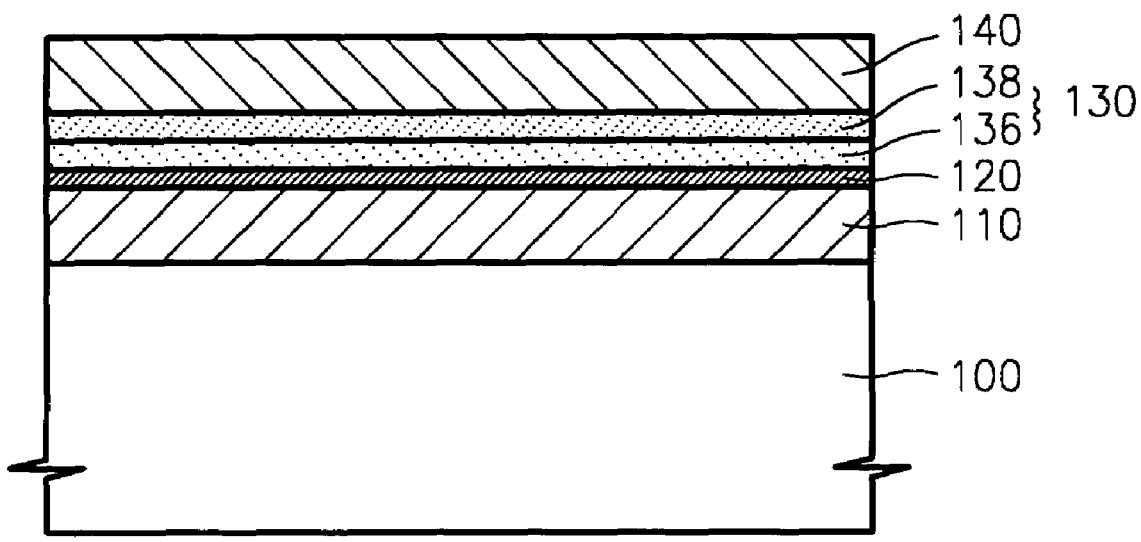
FIG. 11 is a cross-sectional view of a semiconductor device such as a memory device according to third embodiments of the present invention.
Figure 12:
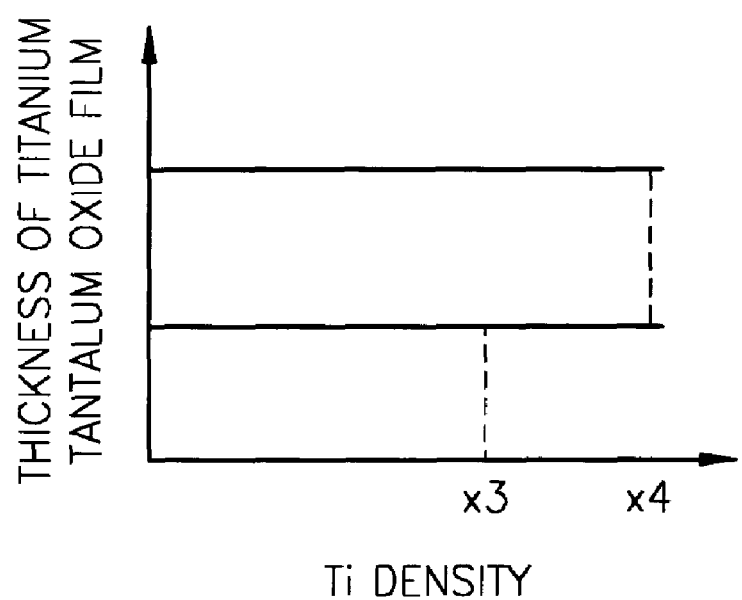
FIG. 12 is a graph illustrating densities of titanium with respect to the thickness of the tantalum titanium oxide film according to third embodiments of the present invention.

FIG. 11 is a sectional view of a semiconductor device such as a memory device according to third embodiments of the present invention, and FIG. 12 is a graph illustrating the density of titanium with respect to the thickness of the tantalum titanium oxide film according to third embodiments of the present invention. Here, the same elements as those of the first and the second embodiments will have the same reference numerals, and overlapping descriptions will be omitted.

Referring to FIGS. 11 and 12, a first tantalum titanium oxide film 136, having a relatively low-density of doped titanium, is deposited on the upper surface of the lower electrode 110 over the semiconductor substrate 100. Here, the first tantalum titanium oxide film 136 includes in the range of approximately 0.1% to 15% titanium.

A second tantalum titanium oxide film 138, having a relatively high-density of doped titanium, is deposited on the upper surface of the first tantalum titanium oxide film 136. Here, the second tantalum titanium oxide film 138 has higher density of doped titanium than the first tantalum titanium oxide film 136 and, more particularly may include in the range of approximately 10% to 20% titanium.

As discussed above, the first and the second tantalum titanium oxide films 136 and 138 can be formed by supplying the precursors separately or the mixed precursor to the reactor. More particularly, the first and the second tantalum titanium oxide films 136 and 138 can be formed successively. After that, the thermal process can be performed and the upper electrode 140 can be formed in the same manner as the first and the second embodiments.

As explained above, although the tantalum titanium oxide film is formed to be multilayered, the effect thereof can be same as discussed above with respect to the first and the second embodiments. As described above, by using a tantalum titanium oxide film as a dielectric layer of a capacitor, the dielectric layer can be formed such that the tantalum titanium oxide film adjacent to the lower electrode has a suitable density of titanium. Decreases in dielectric constant can be reduced by using the tantalum titanium oxide film as the dielectric layer and performing the thermal process to reduce leakage current. Consequently, leakage current can be reduced, and dielectric characteristics can be improved. As a result, capacitance can be increased.

Embodiments of the present invention may provide an electronic device having dielectric layers improved in terms of dielectric characteristics and leakage current. In particular, although embodiments of the invention have been described with respect to memory devices, dielectric layers according to additional embodiments of the present invention may be used with other electronic devices. For example, dielectric layers according to embodiments of the present invention may be used as gate insulating layers of field effect transistors.

According to embodiments of the present invention, a semiconductor memory device may include a semiconductor substrate, a lower electrode formed on the semiconductor substrate, a dielectric layer (which is an oxide film including titanium and tantalum) on an upper surface of the lower electrode, and an upper electrode on an upper surface of the dielectric layer. Moreoever, the density of titanium in the dielectric layer depends on the thickness of the dielectric layer. The density of titanium of an area of the dielectric layer adjacent to the lower electrode can be in the range of approximately 0.1 to 15 percent.

According to additional embodiments of the present invention, a semiconductor memory device may include a semiconductor substrate, a lower electrode formed on the semiconductor substrate, a reaction suppressing layer formed on an upper surface of the lower electrode, a first tantalum titanium oxide film formed on an upper surface of the reaction suppressing layer, a second tantalum titanium oxide film formed on an upper surface of the first tantalum titanium oxide film, and an upper electrode formed on an upper surface of the second tantalum titanium oxide film. Moreover, the density of titanium of the first tantalum titanium oxide film can be in the range of approximately 0.1 to 15 percent and the density of titanium of the second tantalum titanium oxide film can be higher than or equal to the density of titanium of the first tantalum titanium oxide film. The density of titanium of the second tantalum titanium oxide film can be in the range of approximately 0.001 to 3 percent. The density of titanium of the second tantalum titanium oxide film can be in the range of approximately 10 to 20 percent. The reaction suppressing layer can be one of a silicon nitride film, a silicon oxide film, and/or a silicon oxynitride film. The lower electrode and the upper electrode can be formed of at least one conductive film selected from a doped polysilicon film, a metal film, a metal oxide film, a metal nitride film, and/or a metal oxynitride.

According to yet additional embodiments of the present invention, methods for manufacturing a semiconductor memory device can include (a) forming a lower electrode on an upper surface of a semiconductor substrate, (b) forming a dielectric layer of a oxide film including titanium and tantalum, on an upper surface of the lower electrode, and (c) forming an upper electrode on an upper surface of the dielectric layer. In step (b), the density of titanium in the dielectric layer may depend on the thickness of the dielectric layer, and the density of titanium can be adjusted to be 0.1 to 15 percent.

According to still additional embodiments of the present invention, a method for manufacturing a semiconductor memory device can include (a) forming a lower electrode on an upper surface of the semiconductor substrate, (b) forming a reaction suppressing layer on an upper surface of the lower electrode, (c) forming a first tantalum titanium oxide film on an upper surface of the reaction suppressing layer, (d) forming a second tantalum titanium oxide film on an upper surface of the first tantalum titanium oxide film, (e) applying a thermal process to the first and the second tantalum titanium oxide films under an oxygen atmosphere, and (f) forming an upper electrode on an upper surface of the second tantalum titanium oxide film. In addition, a density of titanium can be adjusted to be in the range of approximately 0.1 to 15 percent when the first tantalum titanium oxide film is formed and a density of titanium of the second tantalum titanium oxide film can be higher than or equal to the density of titanium of the first tantalum titanium oxide film. The density of titanium of the second tantalum titanium oxide film can be in the range of approximately 0.001 to 3 percent.

The reaction suppressing layer can be formed by applying one of a rapid thermal nitridation, a rapid thermal oxidation, or a combination thereof to a surface of the lower electrode.

Steps (b) and (c) may further comprise separately supplying a titanium precursor, a tantalum precursor, and oxygen gas into a reactor, and reacting the titanium precursor, the tantalum precursor, and the oxygen gas with each other within the reactor. The tantalum precursor can be one of a metal alkoxide such as $Ta(OC_2H_5)_5$, an organometalic such as a metal beta deketonate, and/or a metal halide such as $TaCl_5$. The titanium precursor can be a compound such as $Ti(OCH(CH_3)_2)_4$, $Ti(OC_2H_5)_4$, $TiCl_4$, and/or a tetrakis-dimethylamido-titanium (TDMAT).

In steps (c) and (d), the tantalum precursor and the titanium precursor can be mixed outside of the reactor and the mixed substance can be supplied into the reactor. The tantalum precursor can be pentaethoxy tantalum $Ta(OCH_2CH_3)_6$, (PET) and the titanium precursor can be tetraethoxy titanium $Ti(OCH_2CH_3)_4$, (TET). A density of titanium in the dielectric layer can be controlled by the deposition temperature and the flow rate of the precursor.

The tantalum titanium oxide film can be formed at a temperature in the range of approximately 100° C. to 700° C. and at a pressure in the range of approximately 100 to 760 mTorr. In steps (c) and (d), the tantalum precursor and the titanium precursor can be provided at a rate in the range of approximately 5 to 200 mg/min and the oxygen gas can be supplied at a rate in the range of approximately 10 sccm to 10 slm.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method of forming an electronic device, the method comprising:
   forming a first electrode;
   after forming the first electrode, forming a dielectric oxide layer on the first electrode wherein the dielectric oxide layer includes titanium, wherein a first portion of the dielectric oxide layer adjacent the first electrode has a first density of titanium, and wherein a second portion of the dielectric oxide layer opposite the first electrode has a second density of titanium less than the first density; and
   after forming the dielectric oxide layer, forming a second electrode on the dielectric oxide layer so that the dielectric oxide layer is between the first and second electrodes.

2. A method according to claim 1 wherein the dielectric oxide layer further includes tantalum.

3. A method according to claim 1 wherein the dielectric oxide layer comprises tantalum titanium oxide.

4. A method according to claim 1 wherein forming the first electrode comprises forming the first electrode on a substrate so that the first electrode is between the substrate and the dielectric oxide layer.

5. A method according to claim 1 wherein the first density of titanium is in the range of approximately 0.1 to 15 percent.

6. A method according to claim 1 wherein the second density of titanium is in the range of approximately 0.001 to 3 percent.

7. A method according to claim 1 wherein each of the first and second electrodes comprises at least one of doped polysilicon, metal, metal oxide, metal nitride, and/or metal oxynitride.

8. A method according to claim 1 further comprising:
   forming a reaction suppressing layer between the first electrode and the dielectric layer.

9. A method according to claim 8 wherein the reaction suppressing layer comprises at least one of silicon nitride, silicon oxide, and/or silicon oxynitride.

10. The method of claim 8, wherein the reaction suppressing layer is one of a silicon nitride film, a silicon oxide film, and a silicon oxynitride film.

11. The method of claim 10, wherein the reaction suppressing layer is formed by applying one of a rapid thermal nitridation, a rapid thermal oxidation, and a combination thereof to a surface of the lower electrode.

12. The method of claim 10, wherein the reaction suppressing layer is formed by chemical vapor deposition.

13. The method of claim 6, wherein forming a dielectric layer further comprises:
   separately supplying a titanium precursor, a tantalum precursor, and oxygen gas into a reactor; and
   reacting the titanium precursor, the tantalum precursor, and the oxygen gas with each other within the reactor.

14. The method of claim 13, wherein the tantalum precursor is one of a metal alkoxide such as $Ta(OC_2H_5)_5$, an organometalic such as a metal beta deketonate, and a metal halide such as $TaCl_5$.

15. The method of claim 13, wherein the titanium precursor is a compound such as one of $Ti(OCH(CH_3)_2)_4$, $Ti(OC_2H_5)_4$, $TiCl_4$, and a tetrakis-dimethylamido-titanium (TDMAT).

16. The method of claim 1, wherein forming a dielectric layer comprises mixing, a tantalum precursor and a titanium precursor outside of a reactor and supplying a mixture of the titanium and tantalum precursors into the reactor.

17. The method of claim 1, wherein a density of titanium in the dielectric layer is controlled by the deposition temperature and the flow rate of the precursor.

18. A method for manufacturing a semiconductor memory device, the method comprising:
   (a) forming a lower electrode on an upper surface of the semiconductor substrate;
   (b) forming a reaction suppressing layer on an upper surface of the lower electrode;
   (c) forming a first tantalum titanium oxide film on an upper surface of the reaction suppressing layer;
   (d) after forming the first tantalum titanium oxide film, forming a second tantalum titanium oxide film on an upper surface of the first tantalum titanium oxide film wherein the second tantalum titanium oxide film has a titanium density less than a titanium density of the first tantalum titanium oxide film;
   (e) applying a thermal process to the first and the second tantalum titanium oxide films under an oxygen atmosphere; and
   (f) forming an upper electrode on an upper surface of the second tantalum titanium oxide film,
   wherein a density of titanium is adjusted to be 0.1 to 15 percent when the first tantalum titanium oxide film is formed.

19. The method of claim 18, wherein a density of titanium of the second tantalum titanium oxide film is 10 to 20% percent.

20. The method of claim 18, wherein the reaction suppressing layer is one of a silicon nitride film, a silicon oxide film, and a silicon oxynitride film.

21. The method of claim 20, wherein the reaction suppressing layer is formed by applying one of a rapid thermal nitridation, a rapid thermal oxidation, or a combination thereof to a surface of the lower electrode.

22. The method of claim 20, wherein the reaction suppressing layer is formed by chemical vapor deposition.

23. The method of claim 18, wherein steps (c) and (d) further comprise:
   separately supplying a titanium precursor, a tantalum precursor, and oxygen gas into a reactor; and
   reacting the titanium precursor, the tantalum precursor, and the oxygen gas with each other within the reactor.

24. The method of claim 23, wherein the tantalum precursor is one of a metal alkoxide such as $Ta(OC_2H_5)_5$, an organometalic such as a metal beta deketonate, and a metal halide such as $TaCl_5$.

25. The method of claim 23, wherein the titanium precursor is a compound such as one of $Ti(OCH(CH_3)_2)_4$, $Ti(OC_2H_5)_4$, $TiCl_4$, and a tetrakis-dimethylamido-titanium (TDMAT).

26. The method of claim 18, wherein, in steps (c) and (d), a tantalum precursor and a titanium precursor are mixed outside of a reactor and wherein a mixture of the tantalum and titanium precursors is supplied into the reactor.

27. The method of claim 26, wherein the tantalum precursor is pentaethoxy tantalum $Ta(OCH_2CH_3)_6$, (PET) and the titanium precursor is tetraethoxy titanium $Ti(OCH_2CH_3)_4$, (TET).

28. The method of claim 26, wherein a density of titanium in the dielectric layer is controlled by the deposition temperature and the flow rate of the precursor.

29. The method of claim 26, wherein the tantalum titanium oxide film is formed under a temperature of 100 to 700° and a pressure of 100 to 760mTorr.

30. The method of claim 29, wherein, in steps (c) and (d), the tantalum precursor and the titanium precursor are provided at a rate of 5 to 200mg/mm and the oxygen gas is supplied at a rate of 10sccm to 10sim.

31. A method for manufacturing a semiconductor memory device, the method comprising:
- (a) forming a lower electrode on an upper surface of a semiconductor substrate;
- (b) after forming the lower electrode, forming a dielectric layer of a oxide film including titanium and tantalum, on an upper surface of the lower electrode in a reactor; and
- (c) after forming the dielectric layer, forming an upper electrode on an upper surface of the dielectric layer, wherein, in step (b), the dielectric layer has a first density of titanium adjacent the lower electrode and wherein the dielectric layer has a second density of titanium adjacent the upper electrode and wherein the second density of titanium is less than the first density of titanium;

wherein, in step (b), the first and second densities of titanium are in the range of 0.1 to 15 percent;

wherein, in step (b), a tantalum precursor and a titanium precursor are mixed outside of the reactor and wherein a mixture of the tantalum and titanium precursors is supplied into the reactor;

wherein the dielectric layer is formed at a temperature of 100 to 700° and a pressure of 100to 660mTorr.

32. The method of claim 31, wherein the tantalum precursor and the titanium precursor are provided at a rate of 5 to 200mg/mm and the oxygen gas is supplied at a rate of 10sccm to 10sim.

* * * * *

UNITED STATES PATENT AND TRADEMARK OFFICE
CERTIFICATE OF CORRECTION

PATENT NO. : 7,144,771 B2  Page 1 of 1
APPLICATION NO. : 10/616056
DATED : December 5, 2006
INVENTOR(S) : Gab-jin Nam et al.

It is certified that error appears in the above-identified patent and that said Letters Patent is hereby corrected as shown below:

<u>Column 14,</u>
Line 10, change "660mTorr" to read -- 760mTorr --

Line 13, change "mm" to read -- min --

Line 13, change "sim" to read -- slm --

Signed and Sealed this

Thirteenth Day of March, 2007

JON W. DUDAS
*Director of the United States Patent and Trademark Office*